United States Patent
Oveby et al.

[11] Patent Number: 6,087,948
[45] Date of Patent: Jul. 11, 2000

[54] ENCODER

[75] Inventors: Jan Oveby; Henrik Linde, both of Strangnas, Sweden

[73] Assignee: Leine & Linde AB, Strangnas, Sweden

[21] Appl. No.: 09/089,668

[22] Filed: Jun. 3, 1998

[30] Foreign Application Priority Data

Jun. 3, 1997 [SE] Sweden ................................ 9702100

[51] Int. Cl.[7] .................................................. G08B 21/00
[52] U.S. Cl. .......................... 340/635; 340/659; 340/660; 340/661
[58] Field of Search .................................. 340/635, 500, 340/657, 659, 660, 661; 361/242; 250/505.1

[56] References Cited

U.S. PATENT DOCUMENTS

| | | |
|---|---|---|
| 3,849,698 | 11/1974 | Frohbach . |
| 4,097,732 | 6/1978 | Krause et al. . |
| 4,417,141 | 11/1983 | Phillips . |
| 4,418,288 | 11/1983 | Imai et al. . |
| 4,511,797 | 4/1985 | Pohlig et al. . |
| 4,600,835 | 7/1986 | Ishida et al. . |
| 4,658,132 | 4/1987 | Nishiura et al. . |
| 4,740,689 | 4/1988 | Swiden . |
| 4,827,123 | 5/1989 | Gray . |
| 4,866,268 | 9/1989 | Tang et al. . |
| 4,876,527 | 10/1989 | Oka et al. ................................ 340/441 |
| 5,051,579 | 9/1991 | Tsukiji et al. . |
| 5,302,944 | 4/1994 | Curtis ...................................... 340/653 |
| 5,406,267 | 4/1995 | Curtis ...................................... 340/653 |

FOREIGN PATENT DOCUMENTS

| | | |
|---|---|---|
| 447 680 | 12/1986 | Sweden . |
| 2 204 680 | 11/1988 | United Kingdom . |
| 2 293 876 | 4/1996 | United Kingdom . |
| WO 91/15736 | 10/1991 | WIPO . |

*Primary Examiner*—Julie Lieu

[57] ABSTRACT

A method of establishing a state of an encoder, and an encoder having a state assessment device that includes the steps of generating at least one analogue signal whose amplitude is changed in response to movement between an encoding disc and a detector, generating at least one pulse signal on the basis of the analogue signal by a comparator device, and assessing the amplitude of the analogue signal. The method further includes generating a first status signal on the basis of the amplitude assessment, and generating a second status signal on the basis of one or more of the pulse signals.

20 Claims, 6 Drawing Sheets

ANGULAR POSITION

TABLE 1

| $V_{1A}$ | $V_{2A}$ | DIAGNOSIS | OUTPUT $A_d$ |
|---|---|---|---|
| 0 | 0 | Faultless | Correct |
| 1 | 0 | Somewhat dirty encoding disc | Correct |
| 1 | 1 | Slightly or heavily soiled encoding disc. Possibly error in comparator. | Faulty |
| 0 | 1 | Error in comparator | Faulty |

TABLE 2

| $V_{1A}$ | $V_{3A}$ | $V_{2A}$ | DIAGNOSIS | OUTPUT $A_d$ |
|---|---|---|---|---|
| 0 | 0 | 0 | Faultless | Correct |
| 0 | 1 | 0 | Error in level analyzer | Correct |
| 1 | 0 | 0 | Slightly soiled encoding disc | Correct |
| 1 | 1 | 0 | Heavily soiled encoding disc | Correct |
| 1 | 0 | 1 | Soiled encoding disc / Error in comparator | Faulty |
| 1 | 1 | 1 | Heavily soiled encoding disc | Faulty |
| 0 | 0 | 1 | Error in comparator | Faulty |
| 0 | 1 | 1 | Error in comparator and in level analyzer, or heavily soiled encoding disc and error in level analyzer. | Faulty |

ENCODER

FIELD OF INVENTION

The present invention relates to a method of determining a state in an encoder, and an encoder having state-determining means.

BACKGROUND OF THE INVENTION

Optoelectrical state indicators include an encoding disc that has an optically readable pattern. The disc pattern is read by one or more detectors which each deliver an electric signal in relation to the amount of light that is received in the detector, so that movement of the encoding disc in relation to the detector will be indicated by changes in the electric signal.

The encoding disc includes a periodic pattern, such as a plurality of light and dark fields of mutually the same size, for instance. When the encoding disc is twisted or rotated, the change between dark and light fields can be detected and a change in angle thus determined.

Optoelectrical encoders are often used in environments that are subjected to much vibration, and often in a heavily contaminated environment. The encoder may, for instance, be used to generate the real values of shaft rotation in a paper machine. For instance, the encoder may be hung on a rotating shaft in the paper machine. The encoding disc is caused to rotate as the shaft rotates, and the encoder casing and detector are firmly affixed to the casing of the paper machine.

One problem with the known encoders is that dirt is liable to enter the encoder unit and therewith soil the encoding disc and thereby cause the encoder unit to deliver an incorrect output signal. A further problem is that an encoder unit bearing can become worn after a long period of use, causing a change in the distance of the encoding disc from the detector unit, which, in turn, can result in disagreement of the encoder-unit output signal with the original pattern of the encoding disc.

U.S. Pat. No. 5,302,944 teaches an encoder that includes an encoding disc, a light source and two detectors. The encoder generates two staggered quadrature signals A and B in response to the detector signals. The output signal of the first detector is coupled to a clocked comparator which compares the voltage level of the first detector output signal with a reference level when a clock signal is received. The output of the comparator is supplied to a counter. One of the two quadrature signals is utilized to provide clock pulses for the sampling the other of the two quadrature signals at the peak thereof. When the first detector signal, at the clocked time, is lower than the reference voltage the counter will increase its count value, referred to as error signal e, and the drive voltage to the light source depends on the count value for the purpose of maintaining a certain detector voltage level also when the scale is dirty. Unfortunately the clock pulse signal for checking the A-signal will not be provided if the B-signal malfunctions, since the B-signal is used for the clock signal.

U.S. Pat. No. 4,827,123 describes an encoder that includes a pair of light sources and a pair of light detectors disposed on opposite sides of an optical shuttered disc. The shutters are comprised of two phase-shifted light tranmissive and light blocking areas which result in a change in the output signals from the detectors in accordance with the Gray Code as the optical disc rotates. According to U.S. Pat. No. 4,827,123, four states are defined that occur in a specified first sequence in one rotational direction, and a specific second sequence when the optical disc rotates in the opposite direction. A microprocessor analyses the generated state sequences and when none of the predetermined sequences occurs generates an alarm state indicating that a failure has occurred in one of the light emitters or light detectors or on the optical disc.

SUMMARY OF THE INVENTION

The present invention addresses the problem of providing a method which will facilitate the maintenance of movement-determining or position-determining encoders.

The invention also addresses the problem of providing a method which facilitates the maintenance of control systems that include movement or position, determining encoders.

The invention also addresses the problem of providing a method for generating signals which in combination provide precise information relating to the functional status of an encoder.

The present invention also addresses the problem of providing a conveniently simple method for establishing the functional status of an encoder.

The invention also addresses the problem of providing an encoder which is constructed so as to require fewer components for establishing its functional status and which provides greater reliability.

The invention also addresses the problem of providing an encoder which will reliably indicate whether the encoder output signal is correct or not.

The invention also addresses the problem of providing an encoder that is able to deliver a warning of impaired encoder performance when the encoder output signal is correct and to indicate whether the encoder output signal is correct or not, and to identify one fault source from a number of fault sources.

With the intention of resolving the aforesaid problems or at least minimizing the effects of said problems, there is provided in accordance with one embodiment of the invention a method which comprises the steps of generating at least one analogue signal whose amplitude is changed as a result of movement between an encoding disc and a detector, and generating at least one pulse signal on the basis of said analogue signal by means of a comparator means. The method also comprises the steps of appraising the amplitude of the analogue signal and generating a first status signal on the basis of said amplitude appraisal. The method also includes the step of generating a second status signal on the basis of the pulse signal or signals. The second status signal indicates whether or not the pulse signal, or pulse signals, deviates/deviate from a predetermined pulse signal pattern.

Since the first status signal indicates an impaired function of components that lie upstream of the comparator unit with respect to the signal path, and since the second status signal indicates faults in either the comparator unit or the first mentioned components, this solution affords the advantage whereby the combination of status signals will identify which component or components has/have an impaired function.

The invention solution also enables an individual state identification to be made for each signal path from a detector to the pulse signal output, via a comparator circuit for reforming the analogue signal into a pulse signal. Thus, errors in the signal path for pulse signal A are identifiable independently of the status of signal path B.

According to one embodiment, a deviating pulse signal pattern is determined by counting the number of pulses, or the number of edges of the pulse signal, or pulse signals, within a predetermined movement range, and comparing the counted value with a predetermined threshold count value. The threshold count value corresponds to the number of pattern fields included by the encoding means within said predetermined movement interval, these pattern fields generating signal pulses in coaction with corresponding detectors. The count value is generated by a counter. The counter is set to zero in response to a reference signal pulse generated by a reference pattern of the encoding means at specific movement intervals, such as once for each full revolution.

The counter receives a directional signal that indicates the direction of movement, and is adapted to count-up when movement occurs in one direction and to countdown upon movement in an opposite direction. Thus, the counter value may be zero at the point where direction of movement changes, wherewith the reference signal pulse is generated at this point. With the intention of avoiding an indication of deviating pulse signal patterns when this occurs, it is proposed in accordance with a preferred embodiment of the invention that the counter value is compared with two predetermined threshold values, and that the second status signal is generated when the counter value deviates from both threshold values. One predetermined threshold value is, for instance, zero and the other predetermined threshold value corresponds to the number of pattern fields included by the encoding means between two mutually adjacent reference pattern fields.

According to one embodiment, the method comprises the steps of generating a third status signal on the basis of the signal level of the analogue signal, and indicating a greatly impaired state of the encoding means or the detector when the third status signal indicates that the signal level of the analogue signal is beneath a second predetermined level threshold.

BRIEF DESCRIPTION OF THE DRAWINGS

So that the invention will be more readily understood, the invention will now be described with reference to the accompanying drawings, in which.

Tables are also included with the intention of facilitating an understanding of the invention:

Table 1 illustrates four status signal combinations, a diagnosis, and an assessment of the output signal of each signal combination.

Table 2 illustrates encoder diagnoses and assessments of output signal quality on the occurrence of three status signals according to one embodiment of the invention.

DESCRIPTION OF PREFERRED EMBODIMENTS

Figure 1A:
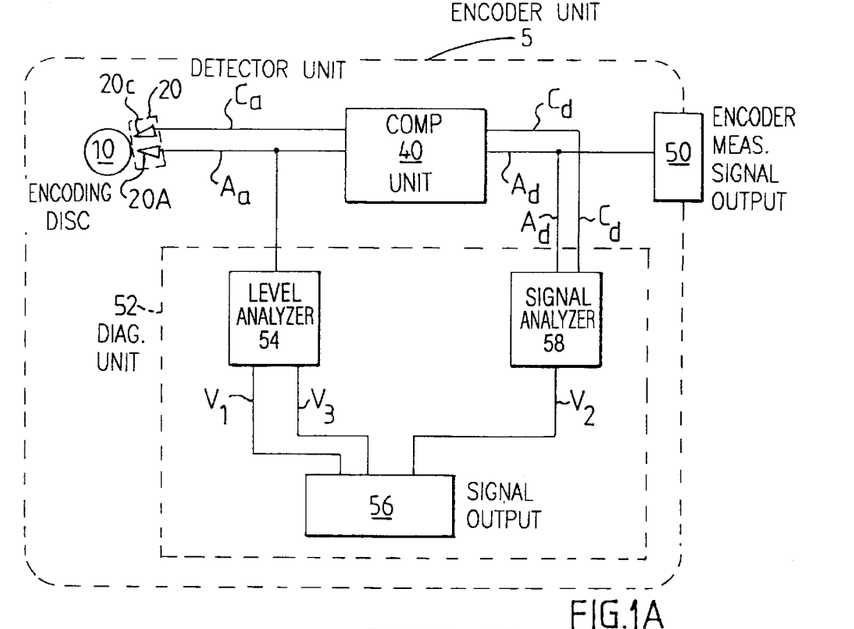
FIG. 1A is a block schematic illustrating a first embodiment of an inventive encoder.

FIG. 1A is a block schematic illustrating an encoder unit 5 which includes an encoding disc 10 and a detector unit 20 for generating analogue electric signals whose amplitudes change in response to rotary movement of the encoding disc. The encoder unit also includes a comparator unit 40 for generating square-wave form signals on the basis of the analogue signals.

Figure 2:
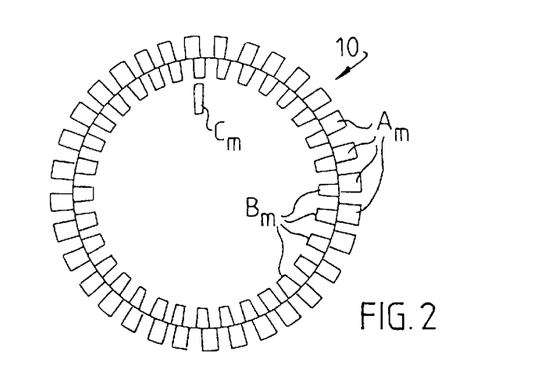
FIG. 2 illustrates a pattern encoding means.
Figure 3A:
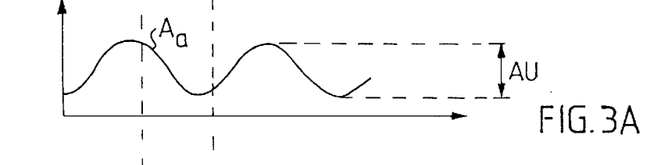
FIGS. 3A and 3B illustrate respectively signals that can be generated in the encoder according to FIG. 1A when the encoding means of FIG. 2 moves relative to corresponding detector means.
Figure 3B:
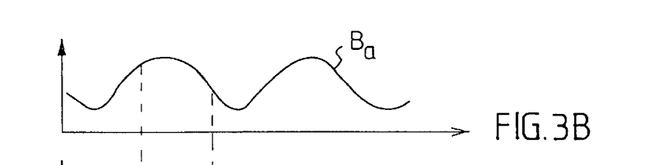

FIG. 2 illustrates a pattern on the encoding disc 10. The pattern includes three pattern groups $A_m$, $B_m$ and $C_m$. As the pattern group $A_m$ is moved in relation to a corresponding detector 20A, a sinusoidal-wave signal is generated, this signal being illustrated in FIG. 3A. FIG. 3B illustrates a sinusoidal signal that is displaced through 90° and that is generated when the pattern $B_m$ is moved in relation to a corresponding detector 20B. The pattern $C_m$ (see FIG. 2) causes the detector unit 20 to generate a reference pulse once with each revolution. The output signals from the detector unit are thus the signals $A_a$ and $B_a$ shown respectively in FIGS. 3A and 3B, and a reference pulse is generated with each full revolution of the encoding disc 10. The comparator unit 40, which may include a Schmitt trigger for each input signal, generates the square-wave pulse trains $A_d$ and $B_d$ from respective sinusoidal signals $A_a$ and $B_a$. The encoder unit thus delivers on its measurement signal output 50 the two square-wave signals $A_d$ and $B_d$ and the reference signal $C_d$.

The encoder also includes a diagnostic unit 52. The diagnostic unit 52 includes a level analyzer 54 whose input is coupled so as to receive the signal $A_a$. Because a soiled or dirty encoding disc will result in poorer contrast and less distinct differences between light and dark parts of the encoding disc, the voltage swing of the electric signal generated by the detector when reading the encoding disc will also decrease as the encoding disc becomes dirtier. A faultless encoder unit having a clean encoding disc will have a voltage swing $\Delta U$ with the value $U_{max}$. Should the encoding disc become covered with a thin layer of dirt, the voltage swing between detector voltage in respect of a dark part and a light part will fall, for instance, to $\Delta U=8/10*U_{max}$. According to one embodiment of the invention, the encoder requires a voltage swing $\Delta U=5/10*U_{max}$ in respect of the sinusoidal signal $A_a$ in order for the comparator unit 40 to generate the square-wave signal with sufficient reliability.

According to one embodiment of the invention, the level analyzer 54 generates a first status signal $V_{1A}$ due to the voltage $\Delta A$ lying beneath a first threshold value. This threshold value may, for instance, be $U_{v1}=8/10*U_{max}$, which indicates that the condition of the encoding disc or of the detector has been impaired. One advantage afforded in this respect is that the disc can be used by a user to generate a warning, so that the encoder can be repaired or replaced before the encoding disc becomes so dirty as to result in an erroneous signal on the encoder output 50. The status signal $V_{1A}$ is delivered to a signal output 56.

According to one embodiment, respective signals $B_a$ and $C_a$ are monitored in the same way, and respective status signals $V_{1B}$ and $V_{1C}$ are also generated.

In one embodiment the signal level of the analogue signals is used for controlling a feed current to Light Emitting Diodes (not shown) illuminating the encoding disc. In this manner the signal level swing from a detector can be maintained at good levels even if the encoding disc becomes dirty and stained.

Referring to FIG. 1A, it will be seen that the diagnostic unit 52 includes a signal analyzer 58 whose input is coupled to the signal output of the comparator unit 40 for the square-wave signal $A_d$. The signal analyzer 58 is adapted to generate a second status signal when the square-wave signal deviates from a predetermined pulse signal pattern. According to one embodiment such a deviating pulse signal pattern is detected by counting the number of pulses or pulse edges of the square-wave signal $A_d$ that occur in the interval between receiving two consecutively generated reference pulses $C_d$, and comparing the count value with a stored value corresponding to the number of pattern parts or the number of pattern boundaries on the encoding disc. The second status signal is delivered to the output 56.

According to one embodiment, the signal $B_d$ is monitored in the same way, and a status signal $V_{2B}$ is generated.

According to another embodiment the signal analyzer 58 operates to analyze the sequence of outputs from the quadrature signals $A_d$ and $B_d$. It will be appreciated that when the encoding disc moves in a first direction the signal combination $A_d B_d$ will follow a sequence 00; 01; 11; 10. When the encoding disc moves in the opposite direction the signal combination $A_d B_d$ will follow the pattern sequence 10; 11; 01; 00. If neither of these pattern sequences is obtained there is a malfunction. A direction detector provides a directional signal in response to the signals $A_d$ and $B_d$. As the encoding disc rotates, the resultant signal combination and the signal which first has a positive or a negative edge provides information as to the direction in which the disc rotates, as is well known to the person skilled in this art. This solution has the advantage of providing indication of a malfunction even when the encoding disc moves back and forth over only a part of a full revolution, i.e. when the C-pulse is not generated.

According to a preferred embodiment the signal analyzer 58 includes circuitry for the above described counting analysis as well as circuitry for analysis of the signal sequence. This has the advantage of providing status reliable status indications both when the encoder is used for measuring fast rotations and when it is used for measuring movements over a small fraction of a revolution.

Figures 4A, 4B:
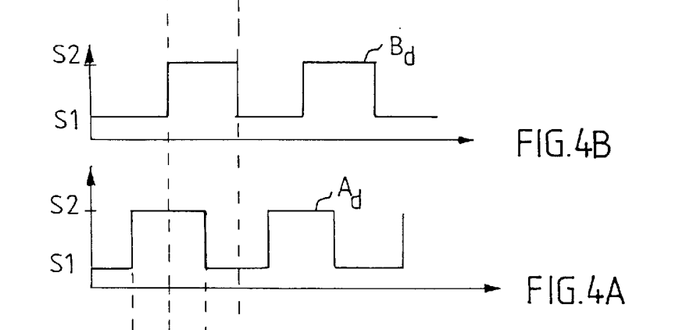
FIGS. 4A and 4B illustrate respectively pulse signals that can be generated in response to signals illustrated in FIGS. 3A and 3B.

Table 1 below illustrates an example of diagnostic results generated by the diagnostic device 52 when monitoring the signals $A_a$ and $A_d$ in the aforedescribed manner. As will be evident from Table 1, the status signal $V_{2A}$ indicates that the output signal $A_d$ is erroneous, i.e. $A_d$ is not in agreement with the pattern $A_m$ (see FIGS. 2 and 4A).

According to one embodiment, the level analyzer includes means for generating a further status signal $V_{3A}$ when the voltage level $\Delta U_A$ of the sinusoidal signal $A_a$ lies beneath a second threshold value $U_{VA3}$. This second threshold value is so low that there is a danger that the comparator unit 40 will not generate a square-wave signal that corresponds to the original pattern of the encoding disc. Thus, it is possible by reading the status signal $V_{3A}$, when the signal $V_{2A}$ indicates that the output signal $A_d$ gives the wrong value to establish whether the error, or fault, lies in:

1) the comparator unit 40, or
2) the detector or the code disc.

When the comparator unit 40 has transit level $5/10*U_{max}$ for switching the signal $A_d$ from a low level to a high level, the second level limit $U_{VA3}$ of the signal $A_a$ will probably be set to $5/10*U_{max}$. In this embodiment of the invention, the second level limit value $U_{VA3}$ will thus coincide with the corresponding transit level of the comparator unit 40.

Table 2 below illustrates an example of the diagnostic results generated by the diagnostic device 52 when monitoring the signals $A_a$ and $A_d$ and generating three status signals $V_{1A}$, $V_{2A}$ and $V_{3A}$ in the aforedescribed manner.

Figure 1B:
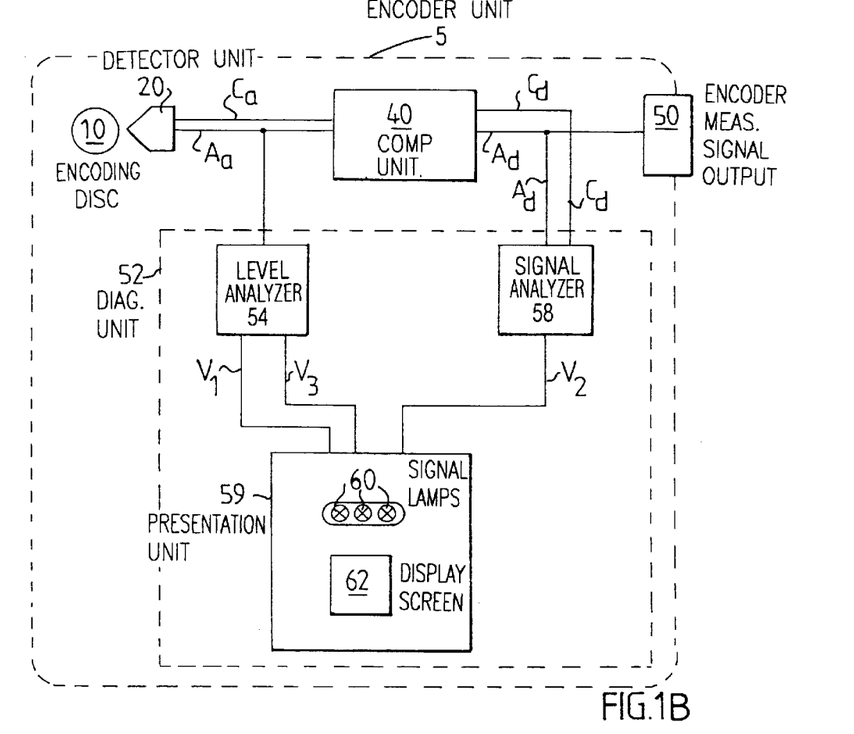
FIG. 1B is a block schematic illustrating an alternative embodiment of the encoder.

In the embodiment illustrated in FIG. 1B, the diagnostic device 52 includes a presentation unit 59 which receives the status signals $V_1$, $V_2$ and $V_3$ and which presents these signals in a way perceptible to a user. According to one embodiment, the presentation unit 59 includes a signal lamp or light-emitting diode for each status signal $V_{1A}$, $V_{2A}$ and $V_{3A}$. Alternatively the encoder may include both a signal output 56 and a presentation unit 59.

According to one embodiment, the presentation unit 59 also includes signal lamps or light-emitting diodes for status signals $V_{1B}$, $V_{2B}$ and $V_{3B}$ indicating the B-signal, and status signals $V_{1C}$ and $V_{3C}$ for indicating the level of the reference signal $C_a$. Since the reference signal $C_a$ can also be monitored by the level analyser, it is possible to establish whether the C-detector/encoding disc or the comparator circuit malfunctions when one or both status signals $V_{2A}$, $V_{2B}$ are activated.

According to another embodiment, the presentation unit 59 includes a display screen 62, for instance in the form of an LCD display. Depending on the combination of status signals concerned, the presentation unit 59 is adapted to present a corresponding text message on the display screen 62. The content of the text message may correspond to the information presented in Table 1 below.

Figure 5:
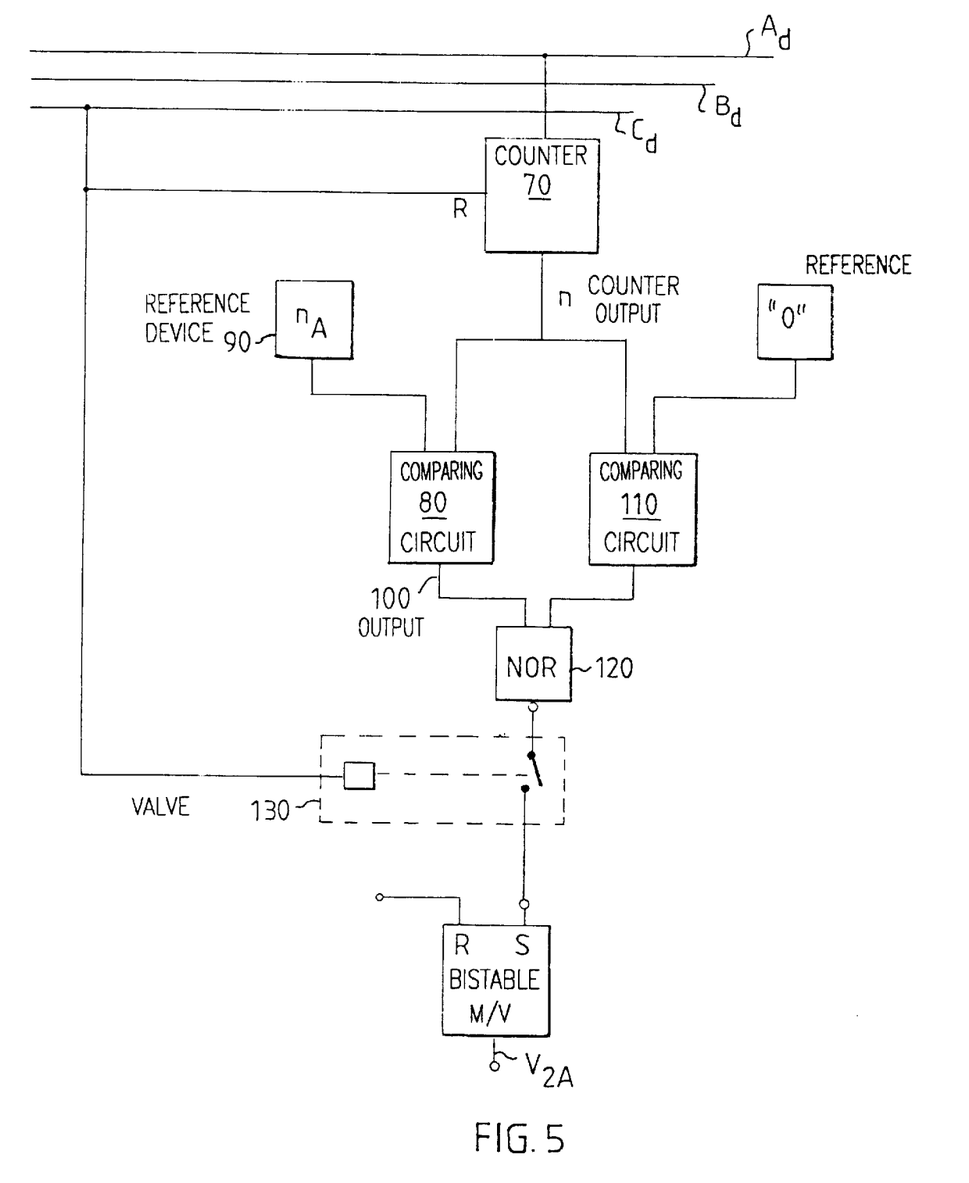
FIG. 5 is a block schematic illustrating one embodiment of a signal analyzer.
Figure 6:
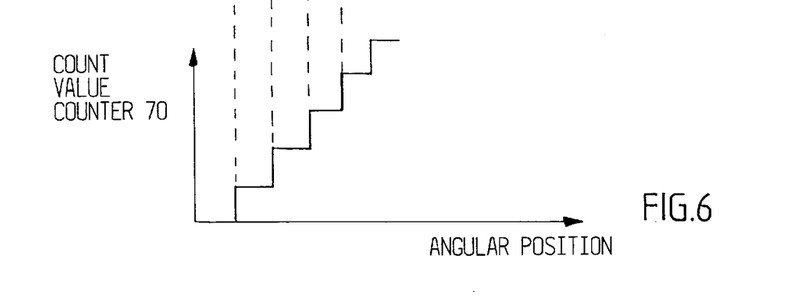
FIG. 6 illustrates a count value generated by a counter included in the signal analyzer according to FIG. 5.

As will be apparent from FIG. 5, the signal analyzer 58 includes a counter 70 which counts the number of pulses or pulse edges of the signal $A_d$. The counter delivers its count value to a comparing circuit 80, which compares the count value with a predetermined value $n_A$. This comparison is made upon receipt of the pulse $C_d$, whereafter the counter is zeroed. The function of the counter 70 is illustrated in FIG. 6. The counter 70 counts the number of pulse edges of the signals $A_d$ and $B_d$, but is zeroed upon receipt of a reference pulse corresponding to the pattern $C_m$. The counter 70 is adapted to count-up in one direction of rotation and to count-down in the opposite direction of rotation. The direction of rotation is determined from the phase relationship between the signals $A_d$ and $B_d$. The counter 70 thus counts the number of pulse edges during one revolution of the encoding disc, by counting the number of edges between two reference pulses $C_d$. This maximum count value is delivered to the comparing circuit 80. Also delivered to the comparing circuit 80 is a correct count value $n_A$ that corresponds to the number of edges that shall be presented by the encoding disc during one revolution. When the encoder unit functions in the manner intended, the maximum count value from the counter 70 will thus correspond to the count value from the reference device 90. If the comparing circuit 80 detects that the two values do not agree, a fault indication signal is generated on its output 100.

When the direction of rotation is changed, the counter 70 will count down until zero ("0") is reached. When the encoder functions correctly, the value "0" will be obtained in conjunction with generating the reference pulse $C_d$. For this reason, the output signal n of the counter 70 is also delivered to a comparing circuit 110 that compares the count value with the value "0" (zero).

When the two input signals n and $n_A$ (or n and "0") of the comparing circuit 80 (and 110) are in agreement, the comparing circuit generates a one ("1") on its output. A NOR circuit 120 receives the signals and generates a "0" when no fault exists.

The NOR circuit 120 generates a "1" (one) when neither of the two comparing circuits indicates agreement.

Since the indicator signal is generated on the output of the NOR gate 120 precisely when receiving the reference pulse $C_d$, a valve 130 is arranged to couple the NOR gate 120 with an RS bistable multivibrator in response to the reference pulse.

The S-input of the RS bistable multivibrator is kept in a normally low state, although if the NOR gate delivers a "1" when the valve 130 is closed, the output signal of the RS bistable multivibrator will be set to "1".

The output of the RS bistable multivibrator delivers the status signal $V_{2A}$.

Figure 7A:
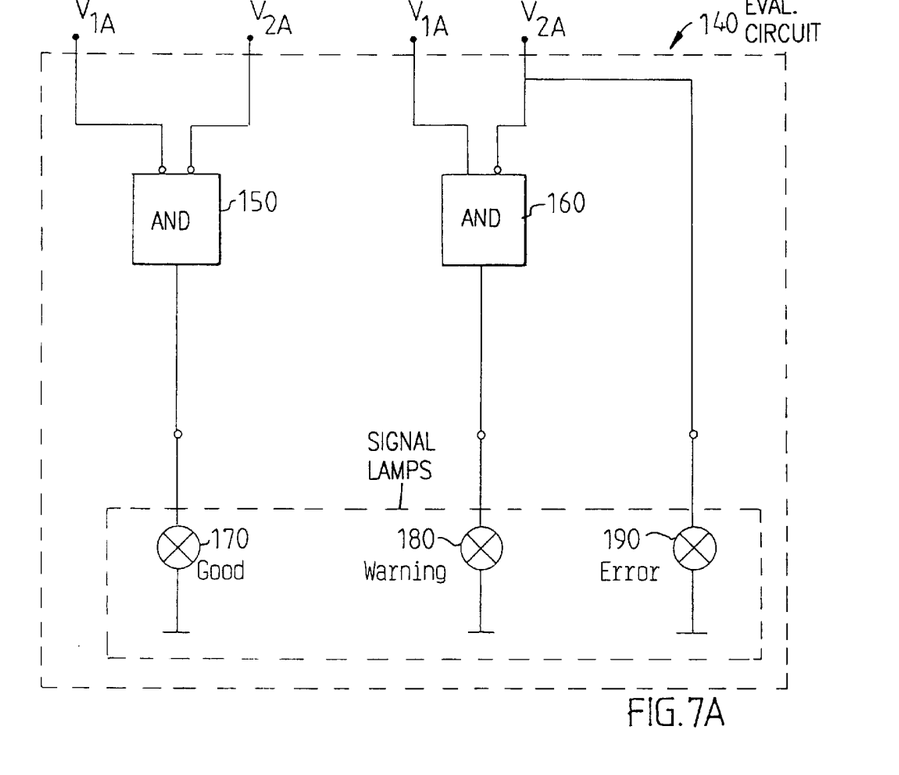
FIG. 7A is a block schematic illustrating an evaluation circuit for generating a qualitative measurement of the condition of the encoder.

FIG. 7A illustrates an evaluating circuit 140 for a qualitative measurement of the condition of the encoder on the basis of the status signals. Three mutually exclusive quality state signals are generated by means of the evaluating circuit.

As will be evident from Table 1, both status signals $V_{1A}$ and $V_{2A}$ are low when the quality of the encoder is satisfactory. By delivering the signals $V_{1A}$ and $V_{2A}$ to a NAND gate 150 (AND gate with complimented inputs), there is generated a signal which at high signal levels indicates that the quality of the encoder is satisfactory.

An AND gate 160 generates a signal that has a high signal level when $V_{1A}$ is high but not $V_{2A}$. The output signal of the AND gate 160 indicates at a high level that the quality of the encoder is impaired, but that the encoder output signal is still reliable.

If the signal $V_{2A}$ goes high, this indicates that the encoder output signal is erroneous.

Thus, there are generated by the circuit shown in FIG. 7A three mutually exclusive function states that can be designated "Good", "Impaired" or "Warning, and "Faulty" or "Error" respectively. As illustrated in FIG. 7A, these three function state signals can each be delivered to a respective signal lamp 170, 180 and 190. According to one preferred embodiment, these signal lamps, or light-emitting diodes, are respectively coloured green, yellow and red.

Figure 7B:
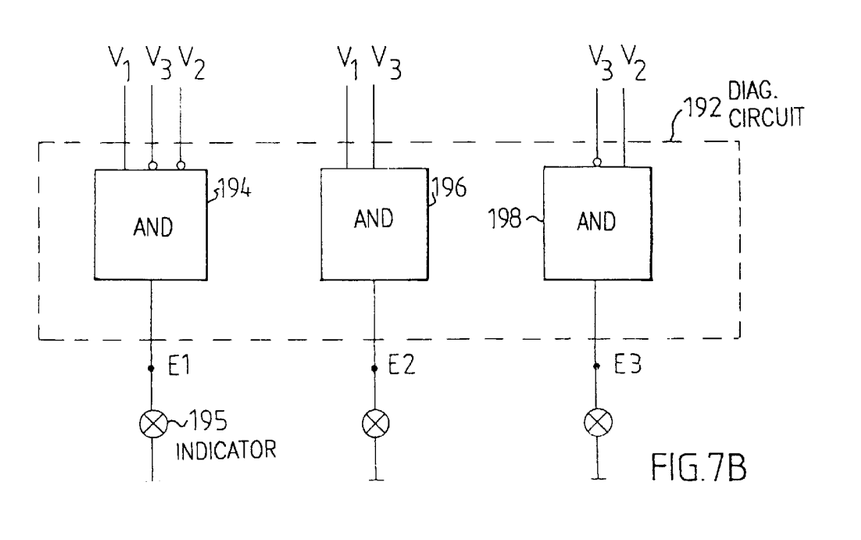
FIG. 7B is a block schematic illustrating a diagnostic circuit for generating mutually excluding functional state indication signals.

FIG. 7B illustrates a diagnostic circuit 192 which generates, on the basis of the status signals $V_1$, $V_2$ and $V_3$, information relating to the error source, or fault source, when the condition of the encoder is impaired. In one embodiment, the diagnostic circuit 192 includes an AND gate 194 that has three inputs, of which two are negated, for generating a first error signal E1. It will be seen from FIG. 7B when taken in combination with Table 2 that the error signal E1 indicates that the encoding disc is somewhat dirty. The signal E1 is coupled to an indicator 195.

The diagnostic circuit also includes an AND gate 196 which determines whether or not the encoding disc is heavily soiled on the basis of the status signals $V_1$ and $V_3$, and which in the illustrated case generates an error signal E2.

An AND gate 198 generates a signal E3 when the status signal $V_2$ is high and the status signal $V_3$ is low. A high signal E3 indicates that the comparator circuit is faulty.

Figure 8:
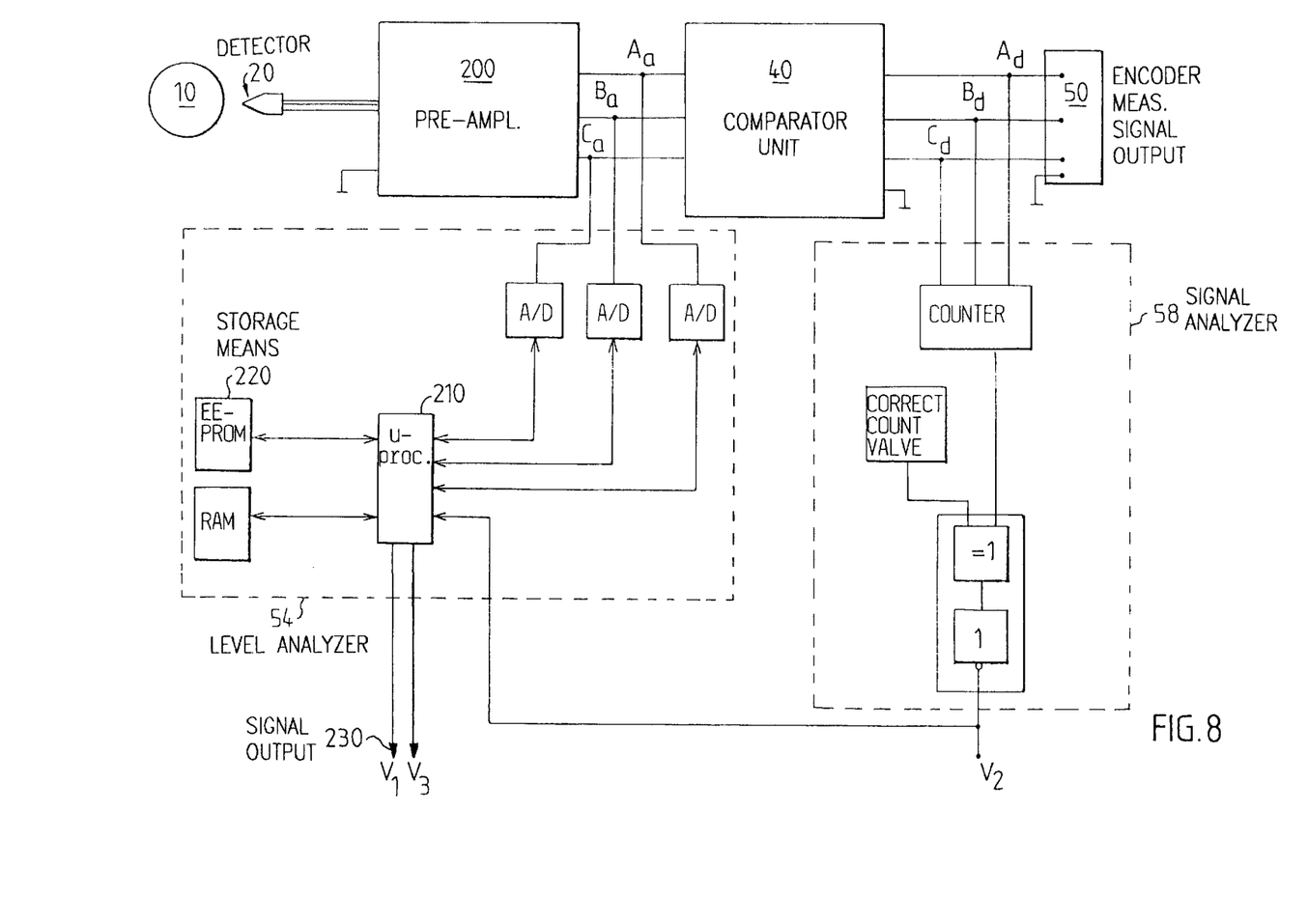
FIG. 8 is a block schematic illustrating a further embodiment of an inventive encoder.

FIG. 8 illustrates another embodiment of an encoder provided with a diagnostic unit.

The detector device 20 delivers respective signals $A_a$, $B_a$ and $C_a$ to a pre-amplifier 200, which increases the signal amplitudes of the detector signals.

According to this embodiment, the analogue signal $A_a$ is applied to an analogue-digital converter whose output thus shows the voltage level of the analogue signal in the form of a digital signal. A microprocessor 210 reads the voltage level and establishes the voltage swing of the analogue signal. This can be achieved, for instance, by establishing the peak-to-peak value of the voltage. Because a dirty encoding disc will result in poorer contrast and less distinctiveness between light and dark parts of the encoding disc, the voltage swing of the electric signal generated by the detector in reading the encoding disc will also decrease as the encoding disc becomes dirtier. The microprocessor thus reads the highest value and the lowest value of the analogue voltage $A_a$ and calculates the voltage difference $\Delta U$ therefrom. A level limit value corresponding to the sensitivity limit of the comparator unit 40 is stored in a storage means 220. The microprocessor reads the voltage level $\Delta U$ at regular intervals and compares this level with said limit value, and generates a first level warning signal on a signal output 230 when the read voltage level $\Delta U$ is lower than said limit value.

In one embodiment of the invention, the microprocessor is able to compare the voltage level $\Delta U$ with two separate limit values. One limit value constitutes a warning level when an error function has not yet occurred but is imminent in the near future. By comparing the voltage level $\Delta U$ with a second limit value that constitutes a lower limit value, there can be generated a warning signal that indicates that the voltage level is now so low as to very likely prevent the comparator unit 40 from generating a square-wave signal that corresponds to the original pattern of the encoding disc.

What is claimed is:

1. A method of determining a state of an encoder, comprising the steps of:
   generating at least one analogue signal whose amplitude is changed in response to movement between an encoding disc and a detector;
   generating at least one pulse signal with the aid of a comparator device on the basis of the analogue signal;
   assessing the amplitude of the analogue signal;
   generating a first status signal on the basis of said amplitude assessment; and
   generating a second status signal on the basis of the at least one pulse signal such that a combination of the first status signal and the second status signal discerns between a malfunction in the comparator device and an impaired state of one of the encoding disk and the detector.

2. A method according to claim 1, wherein the second status signal indicates that the at least one pulse signal deviates from a predetermined pulse signal pattern.

3. A method according to claim 1, comprising the steps of indicating an impaired state of the encoding means or of the detector when the first status signal indicates that the amplitude of the analogue signal is below a predetermined level limit value.

4. A method according to claim 1, comprising the steps of generating a third status signal on the basis of the amplitude of the analogue signal, and by indicating a greatly impaired state of one of the encoding disc and detector when the third status signal indicates that the amplitude of the analogue signal is below a second predetermined level limit value.

5. A method according to claim 1 comprising the step of delivering the status signals to signal outputs on the encoder.

6. A method according to claim 1 including the step of delivering the status signals to a presentation means.

7. A method according to claim 1 including the step of determining a quality measurement on the basis of the status signals.

8. A method according to claim 7, including the step of presenting the determined quality measurement.

9. A state diagnosis method in an encoder, the method comprising the steps of:

generating at least one analogue signal in response to movement between an encoding disc and a detector;

determining a signal level from the at least one analogue signal;

comparing the signal level with at least one level threshold value;

generating a first status signal when the signal level is lower than the at least one level threshold value;

generating a movement indicating signal on the basis of the at least one analogue signal;

counting one of the number of pulse edges and the number of pulses of the movement indicating signal ($A_d$) within a predetermined movement range;

comparing the count value with a predetermined threshold count value; and generating a second status signal when the count value deviates from the predetermined threshold count value.

10. A method according to claim 9, comprising the step of generating a reference signal in response to at least one predetermined relative position between the encoding disc and the detector, said predetermined movement range being determined on the basis of the discrete reference signal ($C_d$).

11. A method according to claim 9 including the step of generating a diagnostic code on the basis of the states of the first status signal and the second status signal.

12. A method according to claim 11 in which the diagnostic code illustrates a warning relating to a dirty encoding disc when the first status signal is activated whilst the second status signal is not activated.

13. A method according to claim 11 wherein a malfunction in the comparator unit is indicated when the second status signal is activated whereas the first status signal is not activated.

14. A method according to claim 9, comprising comparing the count value with two predetermined threshold count values, and generating the second status signal when the count value deviates from both of the threshold count values.

15. An encoder, comprising:

an encoding disc and a detector which are movable relative to one another, wherein said detector is adapted to generate at least one analogue signal having an amplitude which changes with relative positional changes between said encoding disc and said detector;

a comparator device for generating at least one pulse signal on the basis of the analogue signal an amplitude analyzer for generating a first status signal on the basis of the amplitude of the analogue signal, and a signal analyzer for generating a second status signal on the basis of the at least one pulse signal, said amplitude analyzer and said signal analyzer being operatively coupled to the first status signal and the second status signal so as to discern between a malfunction in said comparator device and an impaired state of one of said encoding disc and said detector.

16. An encoder according to claim 15, wherein the encoder includes a signal output;

said level analyzer and said signal analyzer being coupled to an output for providing external access to said first and second status signals.

17. An encoder according to claim 15, wherein the encoder includes a presentation means coupled to said level analyzer and to said signal analyzer for displaying status information.

18. An encoder according to claim 15, wherein a first interpreter is coupled to said level analyzer and to said signal analyzer for establishing a quality measurement indicative of the functional quality of the encoder on the basis of said first and second status signals.

19. An encoder according to claim 15, wherein a diagnostic means is coupled to the level analyzer and to said signal analyzer, said diagnostic means being adapted to generate an error source identification signal on the basis of said status first and second signals.

20. The encoding disc comprises a plurality of pattern groups for providing a plurality of independent light signal paths to said detector, and wherein said amplitude analyzer is connected directly to an output of said detector to receive and analyze said at least one analogue signal.

* * * * *